United States Patent [19]

Yang et al.

[11] Patent Number: 5,438,009

[45] Date of Patent: Aug. 1, 1995

[54] METHOD OF FABRICATION OF MOSFET DEVICE WITH BURIED BIT LINE

[75] Inventors: Ming-Tzong Yang; Gary Hong, both of Hsin-Chu, Taiwan

[73] Assignee: United Microelectronics Corporation, Hsinchu, Taiwan

[21] Appl. No.: 100,307

[22] Filed: Apr. 2, 1993

[51] Int. Cl.$^6$ .................... H01L 27/00; H01L 21/70
[52] U.S. Cl. .......................... 437/52; 437/47; 437/60; 437/919
[58] Field of Search ............ 437/47, 52, 60, 919; 257/304, 306–308, 311

[56] References Cited

U.S. PATENT DOCUMENTS

| | | | |
|---|---|---|---|
| 4,704,368 | 11/1987 | Goth et al. | 437/919 |
| 4,999,811 | 3/1991 | Banerjee | 257/304 |
| 5,101,257 | 3/1992 | Hayden et al. | 357/43 |
| 5,290,726 | 3/1994 | Kim | 437/52 |

*Primary Examiner*—Olik Chaudhuri
*Assistant Examiner*—H. Jey Tsai
*Attorney, Agent, or Firm*—George O. Saile; Graham S. Jones, Jr.

[57] ABSTRACT

A doped FET DRAM includes a silicon substrate, with a buried bit line in the silicon substrate. A plug extends down through the substrate to the bit line. A source region and a drain region are positioned above the plug in the substrate with one thereof connected to the plug with a layer of gate oxide above the source region and drain region. A gate above the gate oxide is juxtaposed with the source region and drain region. The source is connected to a capacitor formed of two layers of polysilicon separated by a dielectric of an ONO oxide layer.

14 Claims, 6 Drawing Sheets

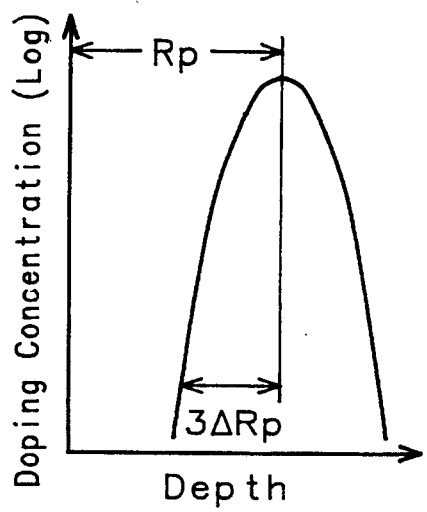
FIG. 7.1
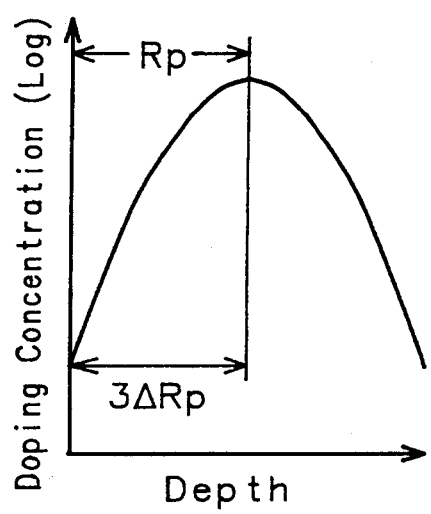
FIG. 7.2
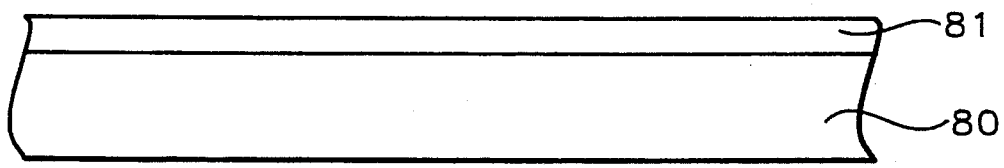
FIG. 8.1
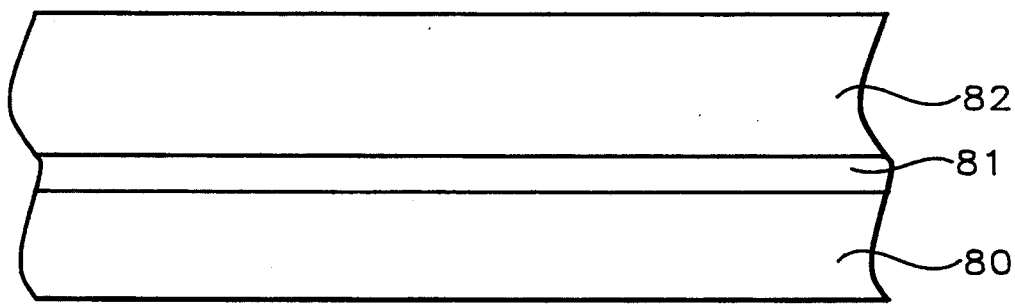
FIG. 8.2

METHOD OF FABRICATION OF MOSFET DEVICE WITH BURIED BIT LINE

BACKGROUND OF THE INVENTION

1. Field of the Invention

This invention relates to DRAMs and more particularly to bit lines therefor.

2. Description of Related Art

In a conventional DRAM bit line step coverage is poor. As can be seen by reference to FIG. 10, which is illustrative of the prior art, the bit line contact step height is very high with polysilicon-1(poly 1), polysilicon-2 (poly 2) and polysilicon-3(poly 3).

SUMMARY OF THE INVENTION

A doped FET DRAM silicon substrate comprises
a) a buried bit line in the silicon substrate,
b) a plug extending down through the substrate to the bit line,
c) a drain region of a transistor positioned above the plug in the substrate with the drain region connected to the plug,
d) a layer of gate oxide above the source and the drain region,
e) a gate above the gate oxide overlying and proximate to the periphery of the source and the drain region, and
f) a capacitor connected to the source region.

Preferably the buried bit line is formed by ion implantation down into a semiconductor substrate.

Preferably the buried bit line is formed by an additive process on top of a semiconductor substrate.

Preferably the plug is formed by ion implantation and annealing down to the buried bit line.

In accordance with another aspect of the invention, a method is provided and a DRAM MOSFET is formed by the steps comprising
a) implanting a buried bit line into the substrate,
b) forming an epitaxial layer above the buried bit line,
c) forming a FOX structure on the surface of a semiconductor substrate, and applying field oxidation,
d) forming a gate oxide onto the substrate,
e) applying polysilicon and etching with a mask,
f) forming source/drain regions in the substrate,
g) forming a PLUG beneath a source/drain region in the substrate,
h) forming a polysilicon structure connected to another of the source/drain regions on the substrate, and
i) forming a polysilicon/ONO/polysilicon capacitor.

Preferably the ion implantation of the buried bit line is performed employing N+ or P+ dopant implanted in the buried layer employing dopant selected from the group consisting of arsenic, phosphorous, and antimony for an N+ dopant to form an NMOS device and the group consisting of boron, and gallium for a P+ dopant to form a PMOS device.

Preferably the chemical species of the dopant implanted in the bit lines is arsenic with a dose of between 1E14 cm$^{-2}$ and about 5E16 cm$^{-2}$, an energy of between about 40 keV 200 keV in a high current implanter type of tool.

Preferably the chemical species of the dopant implanted in the bit lines is phosphorous with a dose of between 1E14 cm$^{-2}$ and about 5E16 cm$^{-2}$, an energy of between about 15 keV and 150 keV in a high current implanter type of tool.

Preferably the chemical species of the dopant implanted in the bit lines is boron with a dose of between 1E14 cm$^{-2}$ and about 5E16 cm$^{-2}$, an energy of between about 10 keV and 100 keV in a high current implanter type of tool.

Preferably the chemical species of the dopant implanted in the source/drain region is selected from the group consisting of phosphorous, arsenic and boron with a dose of between $1 \times 10^{14}$ and about $6 \times 10^{16}$, an energy of between about 20 keV and 120 keV in a high current implanter type of tool, wherein the phosphorous and arsenic dopants are employed for an N+ dopant and boron is employed for a P+ dopant.

Preferably, the buried bit line is implanted to a depth between about 2000 Å and about 20,000 Å.

A method of fabrication of a DRAM MOSFET in accordance with this invention comprises
a) forming a FOX structure on the surface of a semiconductor substrate, and applying field oxidation,
b) implanting a buried bit line into the substrate,
c) forming a gate oxide onto the substrate,
d) applying polysilicon and etching with a mask,
e) forming source/drain regions in the substrate,
f) forming a PLUG beneath a source/drain region in the substrate, and
g) forming a polysilicon structure connected to another of the source/drain regions on the substrate, and
h) forming a polysilicon/ONO/polysilicon capacitor.

Preferably the chemical species of the dopant implanted in the PLUG wherein the N+ dopant is selected from the group consisting of phosphorous (P) and arsenic (As) and for a P+ dopant comprising boron (B) with a dose of between about 1E14 cm$^{-2}$ to about 5E16 cm$^{-2}$, an energy of between about 100 to about 400 keV for P, between about 50 to about 300 keV for B, and between about 150 to about 700 keV for As in a high current implanter type of tool.

Preferably the ion implantation of the buried bit line is performed employing N+ or P+ dopant implanted in the buried layer, where the N+ dopant is selected from the group consisting of phosphorous (P) and arsenic (As) and where the P+ dopant selected from the group consisting of boron (B) and gallium (Ga) with a dose of between about 1E14 cm$^{-2}$ to about 5E16 cm$^{-2}$, an energy of between about 300 to about 800 keV for P, between about 100 to about 400 keV for B, and between about 800 to about 1200 keV for As in a high current implanter type of tool.

Preferably the chemical species of the dopant implanted in the source/drain region is N+ dopant is selected from the group consisting of phosphorous (P) and arsenic (As) and where the dopant is a P+ dopant comprising of boron (B) with a dose of between about 1E14 cm$^{-2}$ to about 6E16 cm$^{-2}$, an energy of between about 300 to about 800 keV for P, between about 100 to about 400 keV for B, and between about 800 to about 1200 keV for As in a high current implanter type of tool.

Preferably the buried bit line is implanted to a depth between about 0.2 μm and about 2 μm.

Preferably all of the implantations are performed at a high current with high energy.

Preferably all of the implantations are performed at a high current with low energy.

Preferably the PLUG is implanted with a dopant where when the dopant is N+, the dopant is selected from the group consisting of phosphorous (P) and arsenic (As) and where the dopant is a P+ dopant comprising of boron (B) with a dose of between about 1E14 cm$^{-2}$ to about 6E16 cm$^{-2}$, an energy of between about 100 to about 400 keV for P, between about 80 to about 300 keV for B, and between about 150 to about 700 keV for As.

An alternative method of fabrication of a DRAM MOSFET comprises a) implanting a buried bit line into the substrate,
b) forming an epitaxial layer above the buried bit line,
c) forming a FOX structure on the surface of the semiconductor substrate, and performing a field oxidation step,
d) forming a gate oxide onto the substrate,
e) applying polysilicon and etching with a mask,
f) forming source/drain regions in the substrate,
g) forming a PLUG beneath a source/drain region in the substrate,
h) forming a polysilicon structure connected to another of the source/drain regions on the substrate, and
i) forming a polysilicon/ONO/polysilicon capacitor.

Preferably the chemical species of the dopant implanted in the PLUG wherein the N+ dopant is selected from the group consisting of phosphorous (P) and arsenic (As) and for a P+ dopant comprising boron (B) with a dose of between about 1E14 cm$^{-2}$ to about 5E16 cm$^{-2}$, an energy of between about 100 to about 400 keV for P, between about 50 to about 300 keV for B, and between about 150 to about 700 keV for As in a high current implanter type of tool.

Preferably the ion implantation of the buried bit line is performed employing N+ or P+ dopant implanted in the buried layer, where the N+ dopant is selected from the group consisting of phosphorous (P) and arsenic (As) and where the P+ dopant selected from the group consisting of boron (B) and gallium (Ga) with a dose of between about 1E14 cm$^{-2}$ to about 5E16 cm$^{-2}$, an energy of between about 15 to about 150 keV for P, between about 10 to about 100 keV for B, and between about 40 to about 200 keV for As in a high current implanter type of tool.

Preferably the chemical species of the dopant implanted in the source/drain region is N+ dopant is selected from the group consisting of phosphorous (P) and arsenic (As) and where the dopant is a P+ dopant comprising of boron (B) with a dose of between about 1E14 cm$^{-2}$ to about 6E16 cm$^{-2}$, an energy of between about 10 to about 120 keV for P, between about 10 to about 120 keV for B, and between about 20 to about 120 keV for As in a high current implanter type of tool.

Preferably all of the implantations are performed at a high current with high energy.

Preferably all of the implantations are performed at a high current with low energy.

Preferably the PLUG is implanted with a dopant where when the dopant is N+, the dopant is selected from the group consisting of phosphorous (P) and arsenic (As) and where the dopant is a P+ dopant comprising of boron (B) with a dose of between about 1E14 cm$^{-2}$ to about 6E16 cm$^{-2}$, an energy of between about 100 to about 400 keV for P, between about 80 to about 300 keV for B, and between about 150 to about 700 keV for As.

BRIEF DESCRIPTION OF THE DRAWINGS

The foregoing and other aspects and advantages of this invention are explained and described below with reference to the accompanying drawings, in which:

FIG. 7.1 shows a graph of doping profile for a process involving a high energy implant (for high energy $3 \times \delta R_p < R_p$.

FIG. 7.2 shows a graph of doping profile for process II involving a low energy implant (for high energy $3 \times \delta R_p = R_p$ or $3 \times \delta R_p > R_p$.

FIGS. 8.1 and 8.2 show an alternative way of forming the bit line buried in the substrate.

DESCRIPTION OF THE PREFERRED EMBODIMENT

Figure 1:
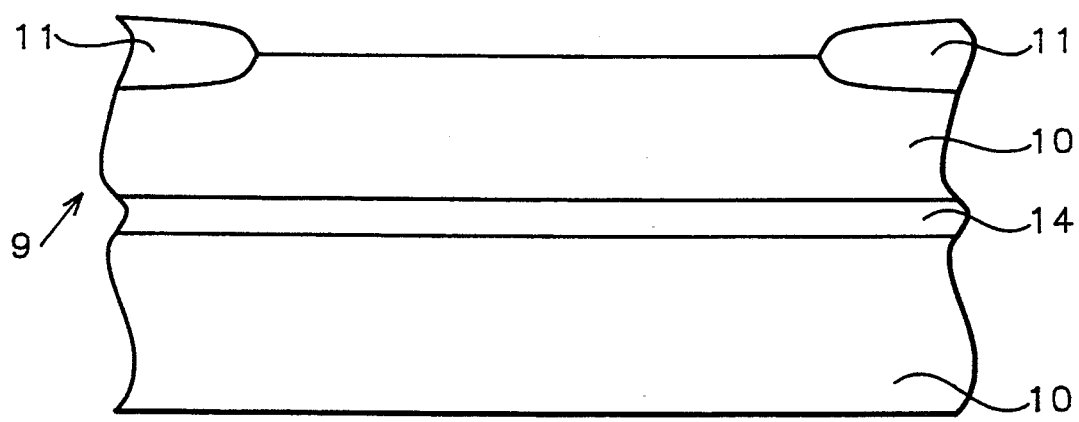
FIGS. 1–5 show the process of forming the DRAM with a bit line buried in the structure in accordance with this invention.

FIG. 1 shows a stage in the manufacture of a semiconductor device 9 on a lightly doped P-type (boron) silicon wafer substrate 10. The silicon substrate 10 had previously been masked with silicon nitride (Si$_3$N$_4$) and then a plasma silicon nitride etch had been performed to remove all of the silicon nitride.

Next, an optional field implantation was performed in the area in which a field oxide is to be formed (next step) to enlarge the threshold voltage. The implantation comprises an N dopant for an N-well and a P dopant for a P-well. On the surface field oxidation (FOX) structures 11 (formed by a well known LOCOS field oxide process) are shown as fragments on the right and on the left. A conventional mask for a buried bit line is formed and then the buried bit line 14 is implanted in semiconductor 10. A plasma nitride etch has been is employed to etch all of the nitride to expose this portion for field oxide structures 11.

A "field IMP" (field implant is implanted in the area being formed as a field oxide. The next step is to enlarge the field threshold voltage. This implant is not always necessary for this invention. (N as used herein refers to an N well and P refers to a P well.)

A field oxide (FOX) structure 11 of thermal oxide is grown where the surface of the silicon substrate is exposed through the mask. After field oxidation, the Si$_3$N$_4$ mask is removed.

Figure 6:
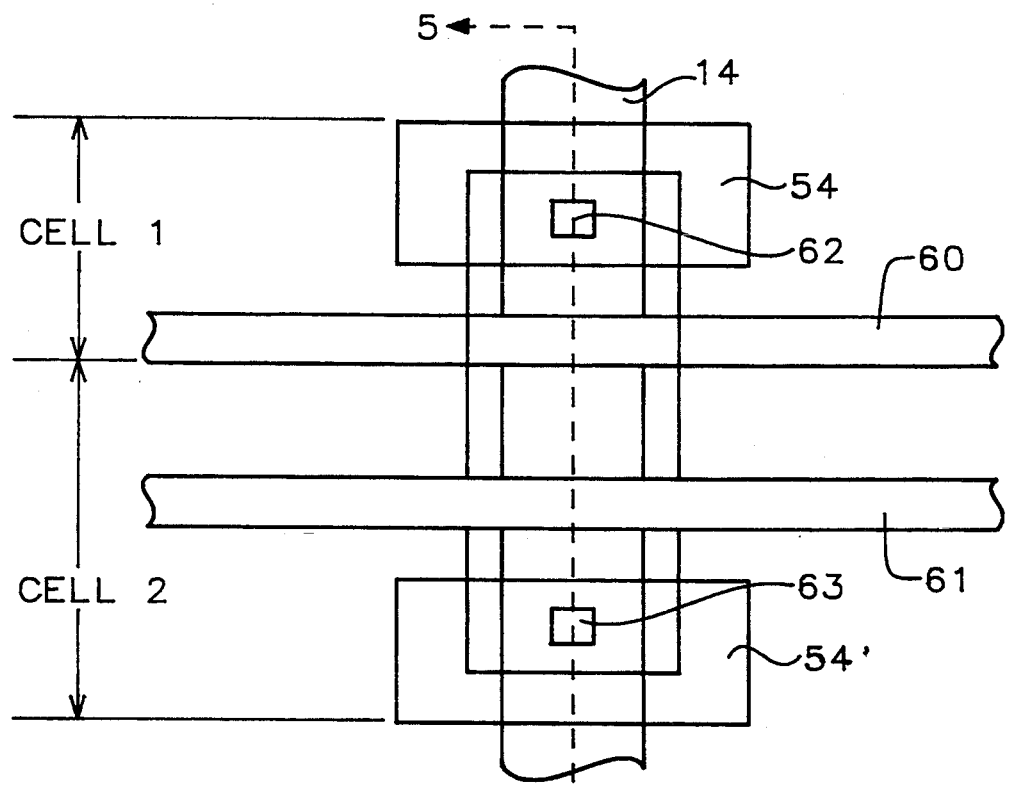
FIG. 6 shows a plan view of the structure produced after the process step in FIG. 5.

A mask for implanting a buried layer 14 with dopant is applied on the surface of the device of FIG. 1 The pattern of buried bit-line 14 comprises a plurality of bars similar to conventional bit lines as shown by bit line 14 in the plan view shown in FIG. 6.

N+ or P+ dopant is implanted in the buried bit line 14 using a conventional ion implantation process and apparatus, including annealing. At the end of the ion implantation step in the process, the resist is removed. For different impurity doping, the annealing temperature is different, but the temperature is greater than about 900° C. for a time greater than about 10 minutes risks damage from the implant process.

Figure 2:
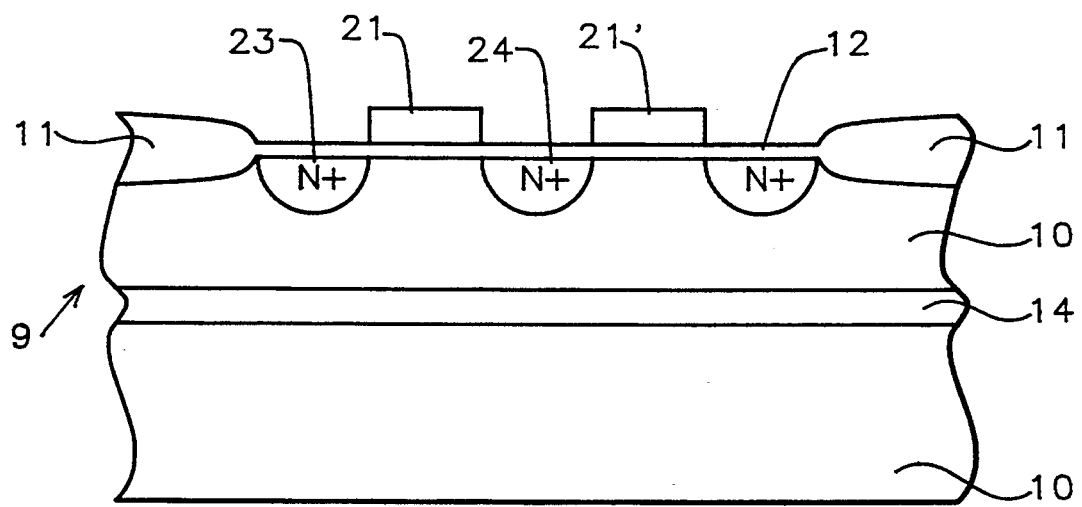

Referring to FIG. 2, the gate oxide is deposited and the gates are formed. A thin layer of silicon dioxide (gate oxide) 12 is applied (grown thermally) to a thickness between about 30 Å and about 300 Å on top of the substrate 10.

A blanket layer of polysilicon is applied in a conventional manner to a thickness of between about 1,000 Å and about 6,000 Å. Preferably, the polysilicon comprises a heavily doped layer of polysilicon formed by thermal reduction of $SiHCl_3$ in hydrogen or by thermal decomposition of silane $SiH_4$ in a reactor between about 600° C. and 650° C. at 0.2 to 1.0 Torr using 100% silane or a diluted mixture of 20–30% silane in nitrogen at about the same pressure, as described in Sze, Semiconductor Devices Physics and Technology, John Wiley & Sons, pages 362–363 (1985).

Next a conventional photolithographic resist layer (not shown) is applied. The resist layer is exposed with a master optical photolithographic mask to form an etching mask on the polysilicon to pattern the polysilicon for etching the polysilicon to form polysilicon gates 21 and 21'. The mask is exposed using an optical lithography mask formed on photoresist mask layer and an optical stepper is employed to expose the wafer.

The polysilicon is etched with a plasma etch in a plasma chamber to form the gate structure. This portion of the polysilicon deposit exposed after the mask is developed is preferably etched anisotropically by $CFCl_2$, $SF_6$, $CCl_4$, $Cl_2/O_2$, $CF_4/O_2$, $HBr/O_2$ in a plasma in a plasma chamber.

While dry plasma etching is preferred, alternatively, the etching may be performed using a wet etchant.

Figure 3:
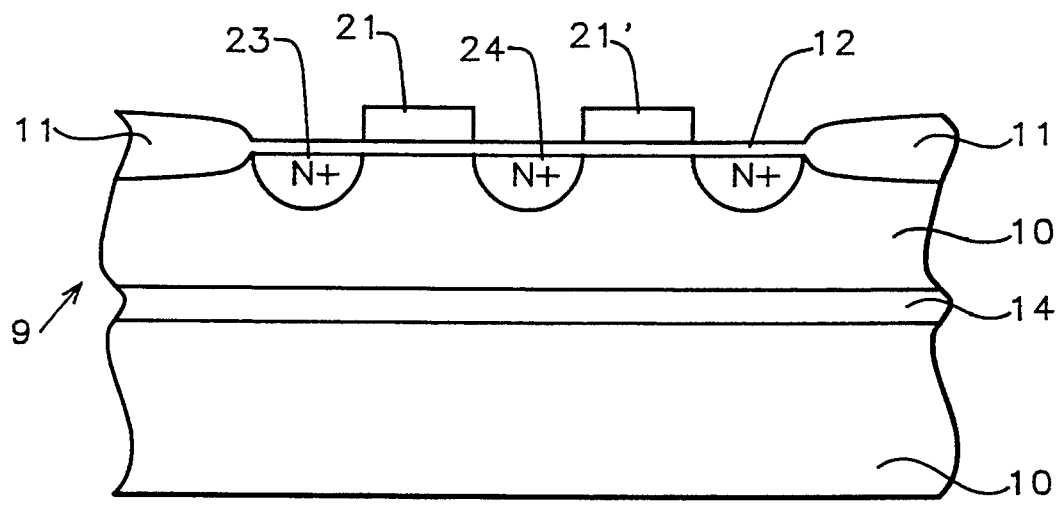

FIG. 3. shows the formation of the source and drain regions of the device.

A blanket layer of photoresist is applied to form the source drain mask using photolithography. The N+ or P+ dopant is implanted into the source region 23 and the drain region 24.

For an N+ dopant, the chemical species of the dopant implanted is phosphorous (P), arsenic (As.) For a P+ dopant boron 11 (B 11) is implanted. In any case the dose applied is between about $1 \times 10^{14}$ cm$^{-2}$ and about $3 \times 10^{16}$ cm$^{-2}$, and it is applied with an energy of between about 20 keV and about 120 keV in a high current implant type of tool. At the end of the ion implantation, the resist is removed by the process of resist strip wet or dry $H_2SO_4/H_2O_2$ or $O_2$/plasma.

Figure 4:
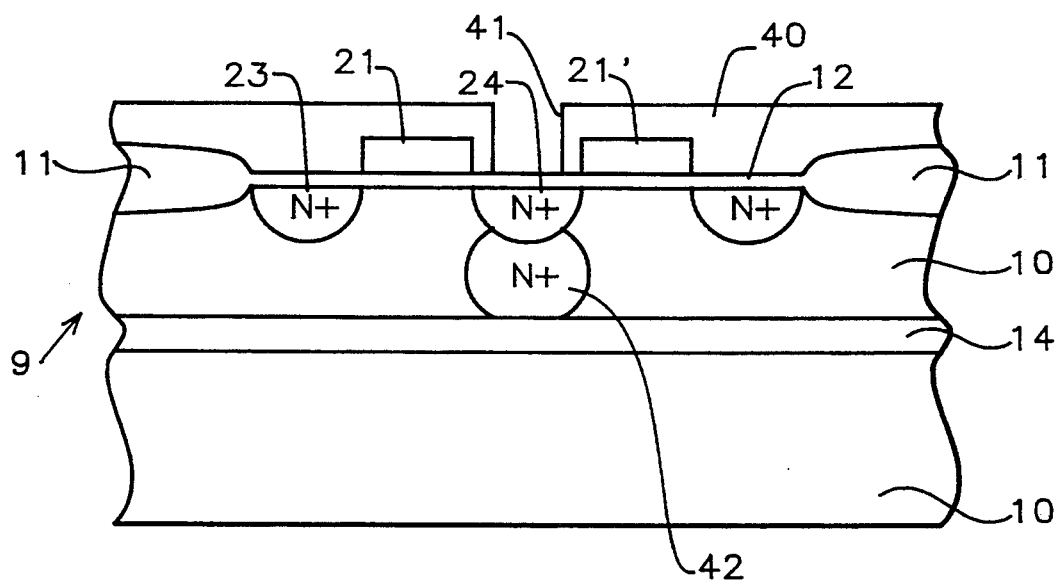

Referring to FIG. 4, the formation of N+ or P+ PLUG 42 is illustrated. A blanket layer of photoresist 40 is deposited upon the product of FIG. 3.

A photolithographic master mask is used to expose the work forming an N+ or P+ plug implant mask to protect the other surrounding areas of the device during ion implantation of the plug implant. The resist is exposed using the mask and employing an optical stepper to expose the resist. The opening 41 is a hole that is formed in the resist above the drain region 24.

An N+ or P+ PLUG 42 is implanted through the opening 41 down to the PLUG implant area 42 below the drain region 24, extending down to the bit line 14. The N+ or P+ dopant is implanted into the silicon substrate 10 down to buried bit line 14 using an conventional ion implantation process and apparatus. Dopants that can be used include phosphorous (P) or arsenic (As) for an N+ dopant. Alternatively, boron (B) or gallium (Ga) can be used for a P+ dopant. The dose would be 1E14 cm$^{-2}$ to about 5E16 cm$^{-2}$, an energy of about 100–400 keV (P), 50–300 keV (B) or 150–700 keV (As) in a high current implant type of tool. At the end of the ion implantation, the resist is removed by the process of wet or dry strip using $H_2SO_4/H_2O_2$ or $O_2$ plasma. Then the implanted species is annealed down to the bit line 14 at in a furnace or by a rapid thermal anneal at a temperature of between about 700° C. and about 1000° C. for between about 5 minutes and about 100 minutes.

Figure 5:
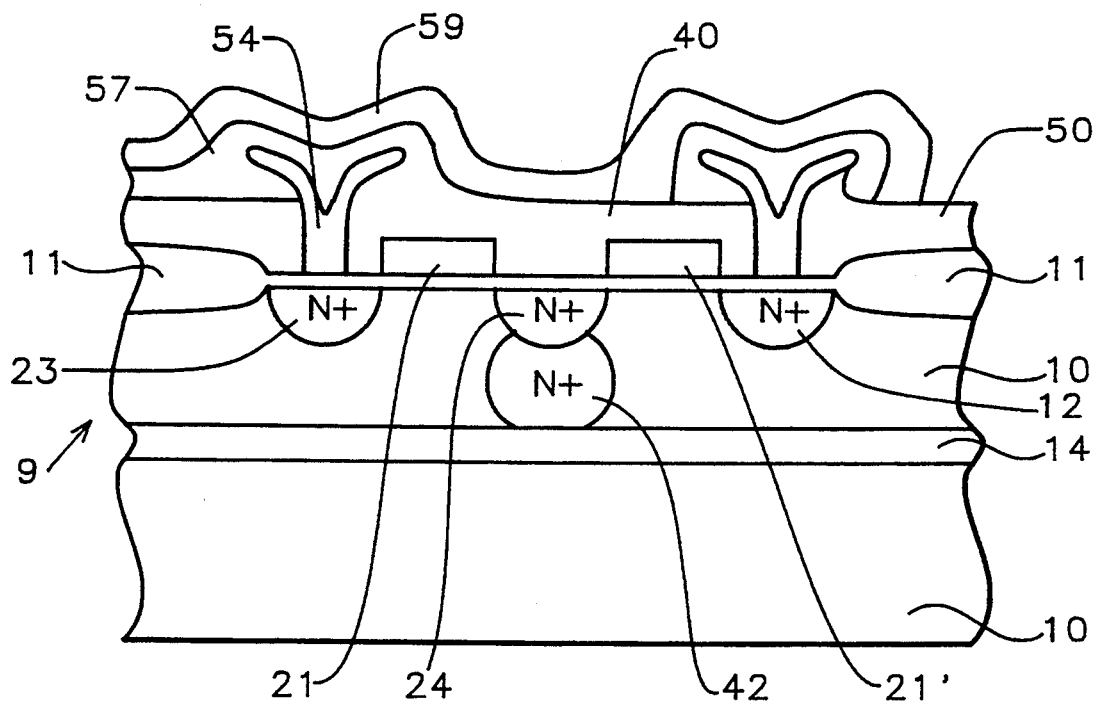

Referring to FIG. 5, the deposition of a sandwich of polysilicon-2 (poly 2) layer 54, interpoly oxide structure 57 which comprises a dielectric of a capacitor structure and polysilicon-3 (poly 3) layer 59 is illustrated.

Oxide Deposition

A layer of oxide 50 is deposited as a blanket layer over the product of the preceding steps described above in connection with FIG. 4.

A mask is applied for etching a via 51 down to the N+ implanted source 23 to prepare for deposition of polysilicon-2 layer 54, interpoly oxide structure 57 and polysilicon-3 layer 59.

Polysilicon on via etch oxide 50 is etched anisotropically by a reactive plasma etching process in a plasma chamber to form the via 51. This portion of the thin layer of silicon dioxide (gate oxide) 12 exposed after formation of via 51 is preferably etched by $CHF_3$, $CF_4$, $CF_4 + H_2$ gas at about room temperature in a plasma chamber. A dry etching process is preferred, but, as an alternative, etching may be performed using a wet etchant.

Next, a blanket layer of polysilicon-2 (poly 2) 54 is applied in a conventional manner to a thickness of between about 300 Å to about 10,000 Å. If capacitance is needed, then the polysilicon-2 layer can be very thick. Preferably, the polysilicon-2 comprises a heavily doped layer of polysilicon formed by thermal reduction of $SiHCl_3$ in hydrogen or by thermal decomposition of silane $SiH_4$ in a reactor between about 600° C. and 650° C. at 0.2 to 1.0 Torr using 100% silane or a diluted mixture of 20–30% silane in nitrogen at about the same pressure, as described in Sze, supra.

The polysilicon is etched by reactive ion etching in a plasma chamber to form the gate structure. This portion of the polysilicon deposit exposed after the mask is developed is preferably etched by $Cl_2$, $CF_4$, HBr, $Cl_2$, $CCl_4$ gas at room temperature in a plasma chamber under anisotropic conditions. Alternatively, while a dry etch is preferred, the etching may be performed using a wet etchant or in a dry etching chamber.

A layer of interpoly oxide (NO or ONO) structure 57 where the first O (silicon dioxide) layer is formed by the process of thermal oxidation at a temperature of between about 750° C. to about 1000° C. or LPCVD high temperature CVD (HTO) at a temperature of between about 650° C. to about 800° C. to a thickness of between about 20 Å and about 150 Å.

The N ($Si_3N_4$) layer of the ONO or ON structure 57 is deposited to a thickness of between about 50 Å and about 200 Å by the process of LPCVD at a temperature of between about 700° C. to about 900° C. Instead of LPCVD, PECVD can be used to deposit the N layer at a temperature of between about 200° C. to about 400° C.

The second O layer is formed by oxidation of $Si_3N_4$ to provide a thin silicon dioxide of between about 10 Å and about 100 Å thick.

Next, a layer 59 polysilicon-3 (poly 3) is applied in a conventional manner to a thickness of between about 200 Å and about 10,000 Å. Preferably, the polysilicon-3 comprises a heavily doped layer of polysilicon formed by thermal reduction of SiHCl$_3$ in hydrogen or by thermal decomposition of silane SiH$_4$ in a reactor between about 600° C. and 650° C. at 0.2 to 1.0 Torr using 100% silane or a diluted mixture of 20-30% silane in nitrogen at about the same pressure, as in Sze, supra.

The polysilicon-3 layer 59 is masked next. Then the polysilicon-3 layer 59 is etched by anisotropic reactive plasma etching in a plasma chamber to form the gate structure. This portion of the polysilicon deposit exposed after the mask is developed is preferably etched by Cl$_2$, CF$_4$, HBr, CCl$_4$ gas at room temperature in a plasma chamber. While a dry etching process is preferred, alternatively, the etching may be performed using a wet etchant.

FIG. 6 shows a plan view of the structure produced after the process step in FIG. 5. The bit line layer 14 beneath (shown in solid lines rather than in phantom is below the surface) and features of the polysilicon-2 layer are illustrated. Those features of the structure in FIG. 6 include the wordline 60 of cell 1, the wordline 61 of cell 2, polysilicon via 62 of cell 1, and polysilicon via 63 of cell 2. Connection between a DRAM transistor and capacitors is provided by polysilicon VIAs. Capacitor 54 is the capacitor of cell 1 and capacitor 54' is the capacitor of cell 2.

FIG. 7.1 shows a graph of doping profile for a high energy implant (for high energy $3 \times \delta R_p < R_p$, after the implant of phosphorous (P), boron (B), or arsenic (As).

FIG. 7.2 shows a graph of doping profile for a low energy implant (for high energy $3 \times \delta R_p = R_p$ or $3 \times \delta R_p > R_p$, after the implant of arsenic (As) or antimony (Sb) for process II.

The buried B N+ bit line can be formed by one of two processes I and II, as follows:

PROCESS I

After field oxide the next step is high energy implantation (no EPI).

1) Well mask and implant LOCOS field oxide
2) LOCOS field oxide.
3) BN+ Masking.
4) BN+ high energy with doping profile FIG. 7.1
Implantation of as follows:
  Boron at an energy within the range from about 100 keV to about 400 keV or
  Arsenic at an energy within the range from about 500 keV to about 1200 keV, with a dose within the range from 5E14 cm$^{-2}$ to about 2E16 cm$^{=2}$ or
  Phosphorous at an energy within the range from 300 keV to about 800 keV with a dose within the range from 5E14 cm$^{-2}$ to about 2E16 cm$^{-2}$.

PROCESS II

Used EPI after bit line (buried layer) Imp
1) BN+ masking
2) BN+ implantation low energy with doping profile FIG. 7.2
Implantation of as follows:
Arsenic (IAs) is implanted at an energy within the range between about 40 keV and about 200 keV or with a dose within the range from 5E14 cm$^{-2}$ to about 2E16 cm$^{-2}$.
3) epitaxial layer FIGS. 8.1 and 8.2 show an alternative way of forming the bit line buried in the substrate.

FIG. 8.1 shows a cross section of the device of method B after an implantation of boron (B) N+ dopant into layer 81 of a semiconductor substrate 80.

FIG. 8.2 shows a cross section of epitaxially grown silicon on top of layer 81 of the boron N+ of the product of FIG. 8.1.

Figure 9:
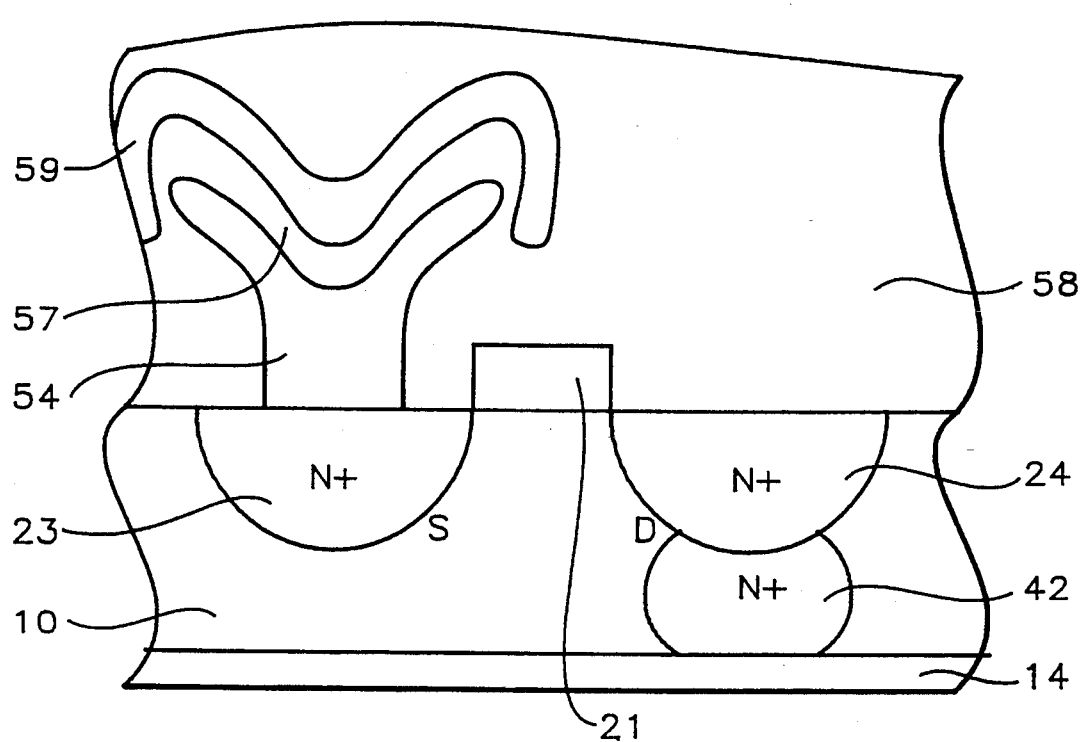
FIG. 9 shows a cross sectional view of an actual device made in accordance with this invention.

FIG. 9 shows a cross sectional view of a device made in accordance with this invention. A buried bit line 14 in substrate 10 is connected up through the doped contact PLUG 42 to the drain region 24. The N+ or P+ dopant is implanted down to buried bit line 14. Gate 21 overlies the periphery of drain region 24 and source region 23. Above the source region 23 is a capacitor structure comprised of layers 54, 57 and 59. Plate 54 of the capacitor is electrically connected to the source region 23. More particularly, polysilicon-2 (poly 2) layer 54, interpoly oxide structure 57 and polysilicon-3 (poly 3) layer 59 form the capacitor structure which overlies source 23. Above the layer 59 is deposited a BPSG layer 58. In summary, the drain region 24 is connected to the bit line 14 through the N+ plug implant 42, and the source 23 is connected to the capacitor 54, 57, 59.

Figure 10:
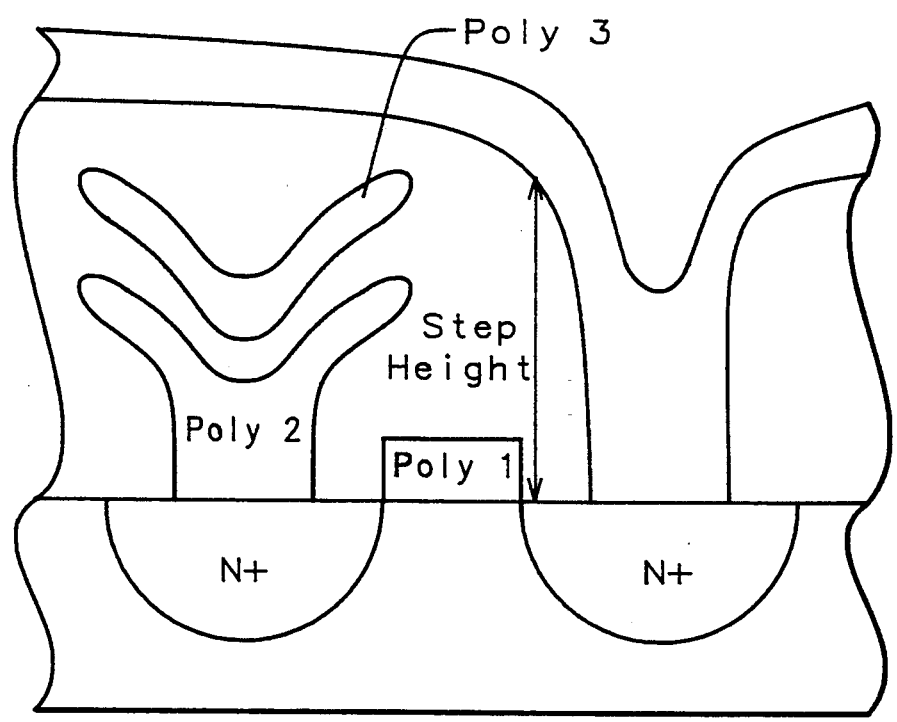
FIG. 10 is a cross sectional view of a prior art device.

FIG. 10 is a cross sectional view of a prior art device in the substrate there are two N+ diffusions with a polysilicon-1 layer bridging the diffusions. A step height is shown above the polysilicon-2 and polysilicon-3 structures formed on the left diffusion.

Figure 11:
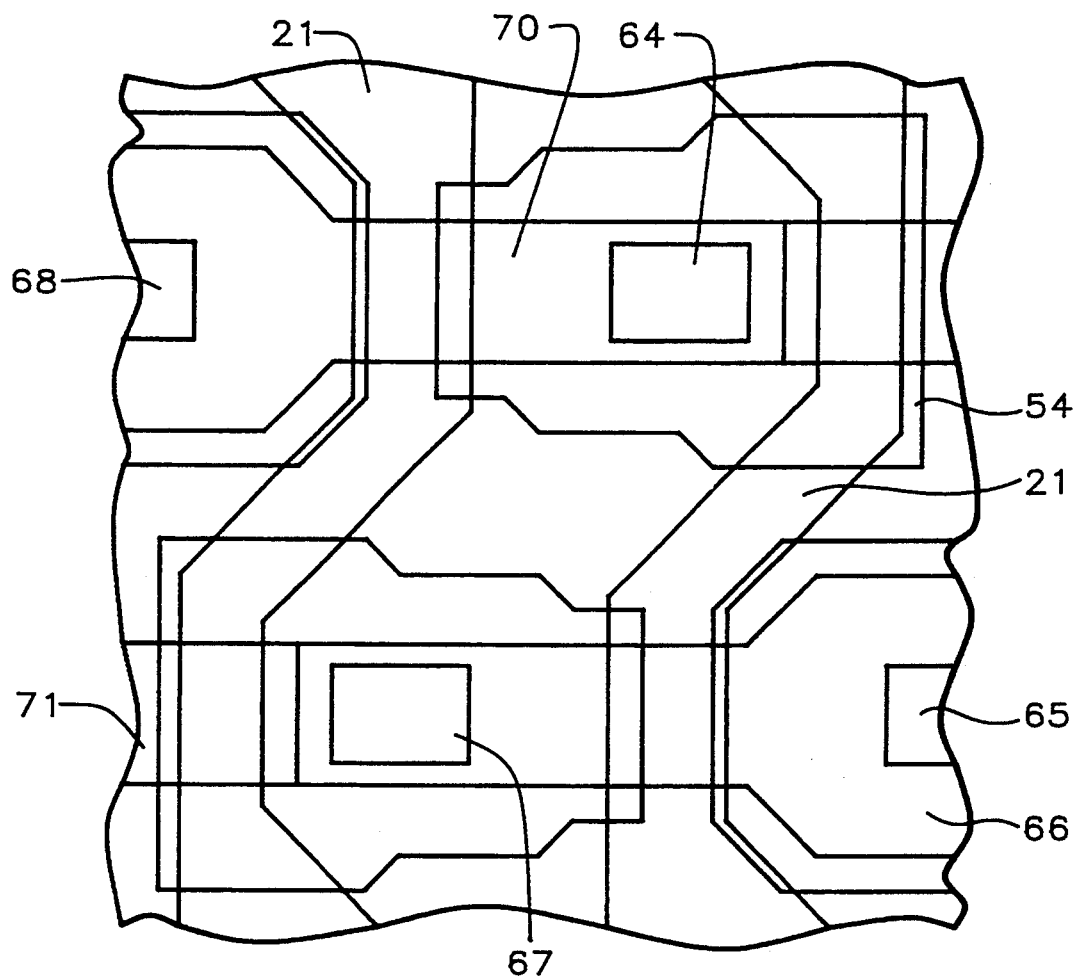
FIG. 11 is apron view of a prior art device.

FIG. 11 is a plan view of a prior art 0.6 μm memory device with polysilicon-1 (poly 1) word lines 21 and 21', polysilicon-2 structure 54, polysilicon-2 contact 64, contact 65, metal 66, contact 67, diffusion 70, and metal bit line 71.

Figure 12:
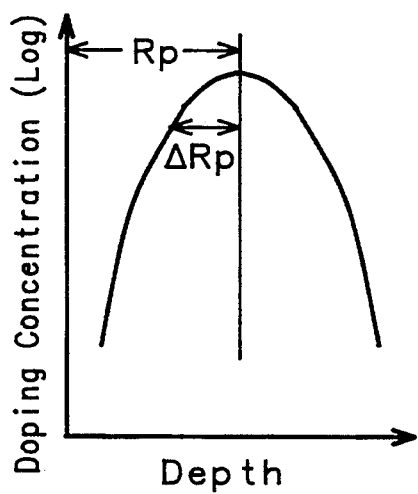
FIG. 12 is a graph from which a doping profile of an implant can be determined ($R_p$ and $\delta R_p$.)

FIG. 12 is a graph from which a doping profile of an implant can be determined ($R_p$ and $\delta R_p$)

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A method of fabrication of a DRAM MOSFET comprising
  a) forming a FOX structure on the surface of a semiconductor substrate, and applying field oxidation,
  b) implanting a buried bit line into said substrate,
  c) forming a gate oxide onto said substrate,
  d) applying polysilicon and etching with a mask,
  e) forming source/drain regions in said substrate,
  f) forming a doped contact PLUG beneath a first one of said source/drain regions in said substrate said PLUG providing connection between said one source/drain region and said buried bit line, and
  g) forming a polysilicon structure connected to a second one of said source/drain regions in said substrate, and
  h) forming a polysilicon/ONO/polysilicon capacitor.

2. A method in accordance with claim 1 wherein the dopant in said PLUG is selected from an N+ dopant in the group consisting of phosphorous (P) and arsenic (As) and from a P+ dopant consisting of boron (B) with a dose of between about 1E14 cm$^{-2}$ and about 5E16 cm$^{-2}$, an energy of between about 100 keV and about 400 keV for P, between about 50 keV and about 300 keV for B, and between about 150 keV and about 700 keV for As in an implanter tool.

3. A method in accordance with claim 1 wherein said ion implantation of said buried bit line is performed employing N+ or P+ dopant implanted in the buried layer, where the N+ dopant is selected from the group consisting of phosphorous (P) and arsenic (As) and where the P+ dopant is selected from the group consisting of boron (B) and gallium (Ga) with a dose of between about 1E14 cm$^{-2}$ and about 5E16 cm$^{-2}$, an energy of between about 300 keV and about 800 keV for P, between about 100 keV and about 400 keV for B, and between about 800 keV and about 1200 keV for As in an implanter tool.

4. A method in accordance with claim 3 wherein the dopant in said source/drain region is selected from an N+ dopant and a P+ dopant, wherein said N+ dopant is selected from the group consisting of phosphorous (P) and arsenic (As) and where said dopant is a P+ dopant consisting of boron (B) with a dose of between about 1E14 cm$^{-2}$ and about 6E16 cm$^{-2}$, an energy of between about 10 keV and about 120 keV for P, between about 10 keV and about 120 keV for B, and between about 20 keV and about 120 keV for As in an implanter tool.

5. A method in accordance with claim 1 wherein said buried bit line is implanted to a depth between about 0.2 μm and about 2 μm.

6. A method in accordance with claim 2 wherein said buried bit line is implanted to a depth between about 0.2 μm and about 2 μm.

7. A method in accordance with claim 1 wherein said PLUG is implanted with a dopant where when said dopant is N+, said dopant is selected from the group consisting of phosphorous (P) and arsenic (As) and where when said dopant is a P+ dopant comprising boron (B) with a dose of between about 1E14 cm$^{-2}$ and about 6E16 cm$^{-2}$, an energy of between about 100 and about 400 keV for P, between about 80 keV and about 300 keV for B, and between about 150 keV and about 700 keV for As.

8. A method of fabrication of a DRAM MOSFET on a semiconductor substrate, said method comprising
 a) implanting a buried bit line into said semiconductor substrate,
 b) forming an epitaxial layer above said buried bit line,
 c) forming a FOX structure on the surface of said semiconductor substrate, and performing a field oxidation step,
 d) forming a gate oxide onto said substrate,
 e) applying polysilicon and etching with a mask,
 f) forming source/drain regions in said substrate,
 g) forming a doped contact PLUG beneath a first one of said source/drain regions in said substrate, said PLUG providing connection between said one source/drain region and said buried bit line,
 h) forming a polysilicon structure connected to a a second one of said source/drain regions on said substrate, and
 i) forming a polysilicon/ONO/polysilicon capacitor.

9. A method in accordance with claim 8 wherein the dopant in said PLUG can be an N+ dopant and a P+ dopant wherein the N+ dopant is selected from the group consisting of phosphorous (P) and arsenic (As) and the P+ dopant comprising boron (B) with a dose of between about 1E14 cm$^{-2}$ and about 5E16 cm$^{-2}$, an energy of between about 100 keV and about 400 keV for P, between about 50 keV and about 300 keV for B, and between about 150 keV and about 700 keV for As in an implanter tool.

10. A method in accordance with claim 8 wherein said ion implantation of said buried bit line is performed employing N+ or P+ dopant implanted in the buried layer, where the N+ dopant is selected from the group consisting of phosphorous (P) and arsenic (As) and where the P+ dopant selected from the group consisting of boron (B) and gallium (Ga) with a dose of between about 1E14 cm$^{-2}$ and about 5E16 cm$^{-2}$, an energy of between about 300 keV and about 800 keV for P, between about 100 keV and about 400 keV for B, and between about 800 keV and about 1200 keV for As in an implanter tool.

11. A method in accordance with claim 10 wherein when the dopant in said source/drain region is an N+ dopant, it is selected from the group consisting of phosphorous (P) and arsenic (As) and where it dopant is a P+ dopant comprising of boron (B) with a dose of between about 1E14 cm$^{-2}$ and about 6E16 cm$^{-2}$, an energy of between about 15 keV and about 150 keV for P, between about 10 keV and about 100 keV for B, and between about 40 keV and about 200 keV for As in an implanter tool.

12. A method in accordance with claim 8 wherein said buried bit line is implanted to a depth between about 0.2 μm and about 2 μm.

13. A method in accordance with claim 9 wherein said buried bit line is implanted to a depth between about 0.2 μm and about 2 μm.

14. A method in accordance with claim 8 wherein said PLUG is implanted with a dopant where when said dopant is N+, said dopant is selected from the group consisting of phosphorous (P) and arsenic (As) and where when said dopant is a P+ dopant comprising of boron (B) with a dose of between about 1E14 cm$^{-2}$ and about 6E16 cm$^{-2}$, an energy of between about 100 keV and about 400 keV for P, between about 80 keV and about 300 keV for B, and between about 150 keV and about 700 keV for As.

* * * * *